United States Patent
Lee et al.

(10) Patent No.: US 12,334,935 B2
(45) Date of Patent: Jun. 17, 2025

(54) CLOCK DATA RECOVERY CIRCUIT OF DISPLAY AND CLOCK RECOVERY CIRCUIT THEREOF

(71) Applicant: LX SEMICON CO., LTD., Daejeon (KR)

(72) Inventors: Jong Suk Lee, Daejeon (KR); Seok Jae Oh, Daejeon (KR); Won Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/669,014

(22) Filed: May 20, 2024

(65) Prior Publication Data

US 2024/0313752 A1 Sep. 19, 2024

Related U.S. Application Data

(63) Continuation of application No. 17/992,744, filed on Nov. 22, 2022, now Pat. No. 12,021,534.

(30) Foreign Application Priority Data

Dec. 9, 2021 (KR) .................. 10-2021-0175592

(51) Int. Cl.
*H03K 5/135* (2006.01)
*H03K 5/14* (2014.01)

(52) U.S. Cl.
CPC .............. *H03K 5/135* (2013.01); *H03K 5/14* (2013.01)

(58) Field of Classification Search
None
See application file for complete search history.

(56) References Cited

U.S. PATENT DOCUMENTS

| 9,984,655 | B2 | 5/2018 | Han et al. |
| 11,018,658 | B1 | 5/2021 | Jeon |
| 2014/0253535 | A1* | 9/2014 | Lim .................. G09G 3/20 345/213 |

FOREIGN PATENT DOCUMENTS

| JP | 2009-504058 | 1/2009 |
| KR | 10-0743493 | 7/2007 |
| KR | 10-2016-010784 A | 9/2016 |
| KR | 10-2021-0088808 A | 7/2021 |

OTHER PUBLICATIONS

Korean Office Action dated Apr. 30, 2025 issued in Patent Application No. KR 10-2021-0175592 with English translation (13 pages).

* cited by examiner

*Primary Examiner* — Cassandra F Cox
(74) *Attorney, Agent, or Firm* — Polsinelli PC

(57) ABSTRACT

A clock data recovery circuit of a display suitable for recovering a clock from a clock data signal. The clock data recovery circuit includes a clock recovery circuit configured to delay an input clock through delay units of multiple stages, and output delayed clocks from the delay units, respectively; and a data recovery circuit configured to recover data of a clock data signal using a recovered clock selected among the delayed clocks.

20 Claims, 4 Drawing Sheets

CLOCK DATA RECOVERY CIRCUIT OF DISPLAY AND CLOCK RECOVERY CIRCUIT THEREOF

CROSS-REFERENCE TO RELATED APPLICATIONS

This application is a continuation of U.S. patent application Ser. No. 17/992,744, filed on Nov. 22, 2022, which claims the priority of the Korean Patent Application No. 10-2021-0175592 filed on Dec. 9, 2021, which are hereby incorporated by reference in their entirety.

BACKGROUND

Field of the Disclosure

The present disclosure relates to a clock data recovery circuit of a display, and more particularly, to a clock data recovery circuit of a display, which recovers a clock from a clock data signal having the clock embedded therein, and a clock recovery circuit thereof.

Description of the Background

A display may include a data transmission device, a data reception device and a display panel.

The data transmission device is configured to transmit data for display. The data transmission device may be understood as a general timing controller. For example, the timing controller may transmit a signal in a format in which a clock is embedded in data, and the signal transmitted in this way may be referred to as a clock data signal.

The data reception device may be configured to receive the clock data signal, recover the clock from the clock data signal, recover the data using the recovered clock, and generate and output a source signal for display using the recovered clock and data. The data reception device may be understood as a general source driver.

The display panel may display a desired image by receiving the source signal.

The data reception device needs to extract and recover the clock from the clock data signal without a separate oscillator, and to this end, may include a clock recovery circuit.

The clock recovery circuit may be designed to recover the clock without a separate oscillator, by being configured on the basis of a delay-locked loop.

The delay-locked loop configured in the clock recovery circuit may include delay units which form a multi-stage delay chain using inverters, and may be configured to recover the clock having the same frequency as the clock of the clock data signal.

The data reception device may convert serial data included in the clock data signal into parallel data using the clock recovered as described above, and may drive the display panel using the converted parallel data.

However, the multi-stage delay chain using inverters is limited in operating frequency, and thus, a frequency range in which data may be recovered may be limited.

To recover data from a clock data signal transmitted at a high speed, the data reception device needs to be improved to be able to recover data with an operating frequency of a wide bandwidth.

SUMMARY

Accordingly, the present disclosure is directed to a clock data recovery circuit of a display and a clock recovery circuit thereof that substantially obviate one or more of problems due to limitations and disadvantages described above.

More specifically, the present disclosure is to provide a clock data recovery circuit of a display capable of recovering a clock from a clock data signal in correspondence to an operating frequency of a wide bandwidth, and a clock recovery circuit thereof.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a clock recovery circuit of a display includes a delay line configured to delay an input clock through delay units of multiple stages, and output delayed clocks from the delay units, respectively; and a mode generator configured to provide a mode signal by comparing a unit delay time between an input-side first delayed clock and an output-side second delayed clock of a delay unit designated in advance with a preset reference delay time, wherein each delay unit outputs the delayed clock by a driving voltage selected between a first driving voltage and a second driving voltage of different levels in response to the mode signal.

In another aspect of the present disclosure, a clock data recovery circuit of a display includes a clock recovery circuit configured to delay an input clock through delay units of multiple stages, and output delayed clocks from the delay units, respectively; and a data recovery circuit configured to recover data of a clock data signal using a recovered clock selected among the delayed clocks, wherein the clock recovery circuit generates a mode signal by comparing a unit delay time between an input-side first delayed clock and an output-side second delayed clock of a delay unit designated in advance with a preset reference delay time, and wherein the clock recovery circuit outputs the delayed clocks by driving the delay units by a driving voltage selected between a first driving voltage and a second driving voltage of different levels in response to the mode signal.

The present disclosure provides advantages in that, by generating delayed clocks using driving voltages having different levels, it is possible to recover a clock in correspondence to an operating frequency of a wide bandwidth.

Accordingly, the present disclosure may recover a clock and data with a wide bandwidth.

In addition, the present disclosure provides advantages in that, since an operating frequency capable of recovering a clock may be selected by comparing unit delay times of the delayed clocks with a preset reference delay time, it is possible to easily implement the recovery of a clock in a high-speed operation.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

A transmission signal for display may be provided from a data transmission device such as a timing controller.

The transmission signal may be received by a data reception device, and the data reception device may recover a clock and data from the transmission signal and drive a display panel using the recovered clock and data. It may be understood that the data reception device corresponds to a source driver for driving the display panel.

In general, the transmission signal may be composed of a packet including a clock signal and a data signal. In aspects of the present disclosure, the transmission signal is defined as a clock data signal.

The clock data signal may have a format in which a clock is embedded in data.

In more detail, the data reception device may be configured to recover the clock from the clock data signal, recover the data using the recovered clock, and generate and output a source signal for display using the recovered clock and data. A clock data recovery circuit of the data reception device for this may be described with reference to FIG. 1.

Figure 1:
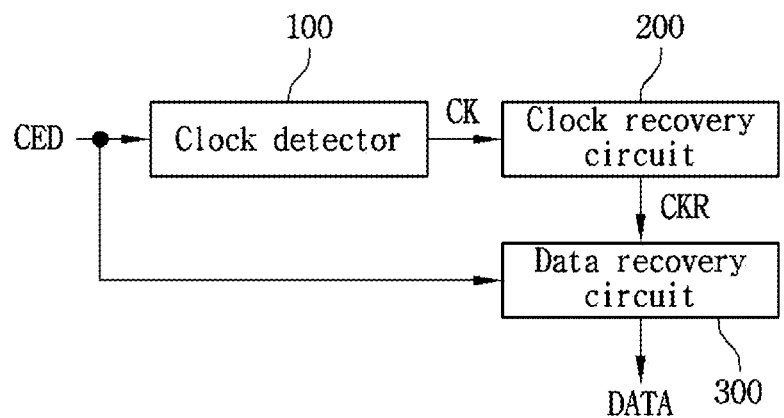
FIG. 1 is a block diagram showing an aspect of a clock data recovery circuit of a display in accordance with the present disclosure.

FIG. 1 shows an aspect of a clock data recovery circuit of a display in accordance with the present disclosure.

In FIG. 1, the clock data recovery circuit may be exemplified as including a clock detector 100, a clock recovery circuit 200 and a data recovery circuit 300.

The clock detector 100 may be configured to receive a clock data signal CED and detect a clock CK from the clock data signal CED. Hereinafter, for the description of the present disclosure, the clock CK is referred to as an input clock CK.

Detecting the input clock CK from the clock data signal CED may be implemented by various methods according to the intention of a fabricator, and detailed description thereof will be omitted. For example, the input clock CK may be detected by determining a transition time point of data included in the clock data signal CED.

The clock recovery circuit 200 may be configured to generate delayed clocks using the input clock CK and provide one selected among the delayed clocks as a recovered clock CKR. The detailed configuration and operation of the clock recovery circuit 200 will be described later with reference to FIGS. 2 to 8.

The data recovery circuit 300 is configured to receive the clock data signal CED, recover the data of the clock data signal CED using the recovered clock CKR and output recovered data DATA.

It may be understood that the data DATA recovered by the data recovery circuit 300 is used to display a display panel (not shown).

In the above configuration, the clock recovery circuit 200 may be described in detail with reference to FIG. 2.

The clock recovery circuit 200 is configured to delay the input clock CK through delay units of multiple stages and output a delayed clock in each delay unit. It may be understood that the delay units of multiple stages correspond to a delay line 20, and the delay line 20 may output delayed clocks CK1 to CK2n+1 by delaying the input clock CK.

The clock recovery circuit 200 may be configured to provide the recovered clock CKR by selecting one of the delayed clocks CK1 to CK2n+1.

Figure 2:
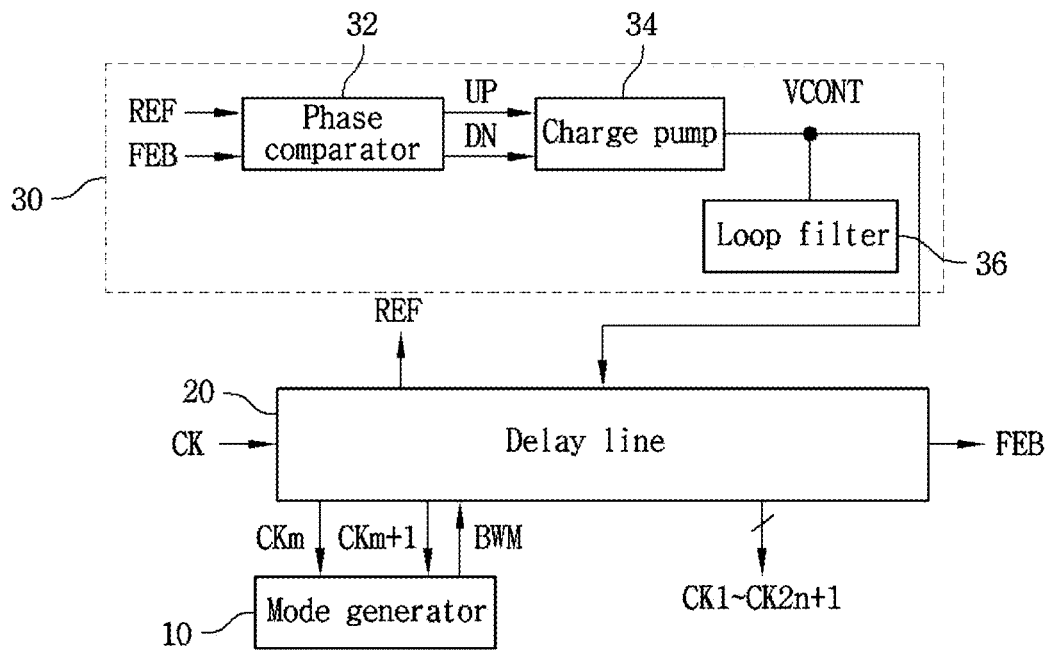
FIG. 2 is a block diagram showing an aspect of a clock recovery circuit of FIG. 1.

In FIG. 2, the clock recovery circuit 200 may be exemplified as including a mode generator 10, the delay line 20 and a delay controller 30.

Among them, the delay line 20 is configured to delay the input clock CK through the delay units of multiple stages which form a delay chain and to output delayed clocks in the respective delay units. The delay units of multiple stages will be described later with reference to FIG. 3.

Each delay unit of the delay units of multiple stages may be configured to output, as a delayed clock, a driving voltage selected between a first driving voltage VDDL and a second driving voltage VDDH of different levels in response to a mode signal BWM. The configuration and operation of each delay unit will be described later in detail with reference to FIG. 4.

The mode generator 10 is configured to receive an input-side first delayed clock CKm and an output-side second delayed clock CKm+1 of a delay unit designated in advance among the plurality of delay units of multiple stages included in the delay line 20, and to provide the mode signal BWM by comparing a unit delay time td between the first delayed clock CKm and the second delayed clock CKm+1 with a preset reference delay time tfd. The mode generator 10 will be described later in detail with reference to FIGS. 5 to 7.

The delay controller 30 is configured to provide a voltage control signal VCONT, corresponding to the phase difference between a reference clock REF and a feedback clock FEB selected among the delayed clocks CK1 to CK2n+1, to each delay unit of the delay line 20.

For example, the delay controller 30 may use the delayed clock CK1 outputted from a first delay unit UD1 of the delay line 20 as the reference clock REF, and may use the delayed clock CK2n+1 outputted from a last delay unit UD2n+1 as the feedback clock FEB.

The delay controller 30 may be configured to include a phase comparator 32, a charge pump 34 and a loop filter 36 to provide the voltage control signal VCONT.

The phase comparator 32 may be configured to output an up control signal UP and a down control signal DN corresponding to the phase difference between the reference clock REF and the feedback clock FEB.

In more detail, the phase comparator 32 may compare the phases of the reference clock REF and the feedback clock FEB, may provide, when the phase of the feedback clock FEB is earlier than that of the reference clock REF, the down control signal DN of a level corresponding to a phase difference to the charge pump 34, and may provide, when the phase of the feedback clock FEB is later than that of the reference clock REF, the up control signal UP of a level corresponding to a phase difference to the charge pump 34.

The charge pump 34 may be configured to provide, to the loop filter 36, an output voltage as charges are charged by performing a pull-up in response to the up control signal UP or charges are discharged by performing a pull-down in response to the down control signal DN.

To this end, the charge pump 34 may include a pull-up element (not shown) and a pull-down element (not shown). The pull-up element may operate to raise the level of the output voltage by performing a pull-up operation in response to the up control signal UP, and the pull-down element may operate to lower the level of the output voltage by performing a pull-down operation in response to the down control signal DN.

The loop filter 36 may be configured to output the voltage control signal VCONT of a level corresponding to the output voltage provided from the charge pump 34.

That is to say, the level of the voltage control signal VCONT outputted from the loop filter 36 may be raised in response to the up control signal UP, and may be lowered in response to the down control signal DN.

Accordingly, the delay line 20 may control the unit delay time td of delay units UD1 to UD2n+1 according to the level of the voltage control signal VCONT of the delay controller 30.

Figure 3:
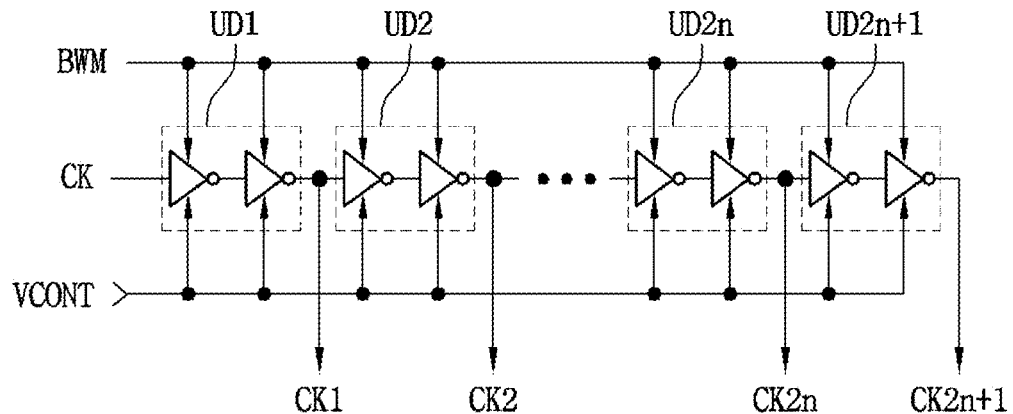
FIG. 3 is a circuit diagram showing an aspect of a delay line of FIG. 2.

The delay line 20 for this may be described with reference to FIG. 3.

The delay line 20 may be configured by a delay chain in which a plurality of inverters are connected in series. In the delay line 20, a pair of adjacent inverters may form one delay unit.

Accordingly, it may be understood that, in the delay line 20, the delay units UD1 to UD2n+1 of multiple stages which are connected in series form the delay chain.

The delay units UD1 to UD2n+1 of multiple stages are configured to delay the input clock CK and output the delayed clocks CK1 to CK2n+1. In other words, the first delay unit UD1 outputs the delayed clock CK1 by delaying the input clock CK, and a second delay unit UD2 outputs the delayed clock CK2 by delaying the delayed clock CK1. In this way, the delayed clocks CK1 to CK2n+1 are outputted from the delay units UD1 to UD2n+1, and the last delay unit UD2n+1 outputs the delayed clock CK2n+1 by delaying the delayed clock CK2n.

The inverters of each of the delay units UD1 to UD2n+1 may be configured to receive the voltage control signal VCONT and the mode signal BWM.

As described above, the unit delay time td of the delay units UD1 to UD2n+1 may be controlled according to the level of the voltage control signal VCONT of the delay controller 30.

The unit delay time td may be understood as a delay time applied to each of the delay units UD1 to UD2n+1.

For example, when the level of the voltage control signal VCONT increases, the unit delay time td of each of the delay units UD1 to UD2n+1 is shortened by an increase in the driving current of a corresponding delay unit, and the operating frequency of delayed clocks increases. Conversely, when the level of the voltage control signal VCONT decreases, the unit delay time td of each of the delay units UD1 to UD2n+1 is lengthened by a decrease in the driving current of a corresponding delay unit, and the operating frequency of delayed clocks decreases.

The delay line 20 may be configured such that the frequency range of the delayed clocks CK1 to CK2n+1 is controlled according to the level of the driving voltage.

The delay line 20 is configured to output the delayed clock delayed by a unit time by using the first driving voltage VDDL or the second driving voltage VDDH. The unit delay time td of each of the delay units UD1 to UD2n+1 of the delay line 20 is changed by the voltage control signal VCONT. The delayed clocks CK1 to CK2n+1 may have operating frequencies of a first frequency range in response to the first driving voltage VDDL, and may have operating frequencies of a second frequency range higher than the first frequency range in response to the second driving voltage VDDH higher than the first driving voltage VDDL.

The control of the frequency range of the delayed clocks CK1 to CK2n+1 according to the level of the driving voltage in the delay line 20 will be described below with reference to FIG. 4.

Figure 4:
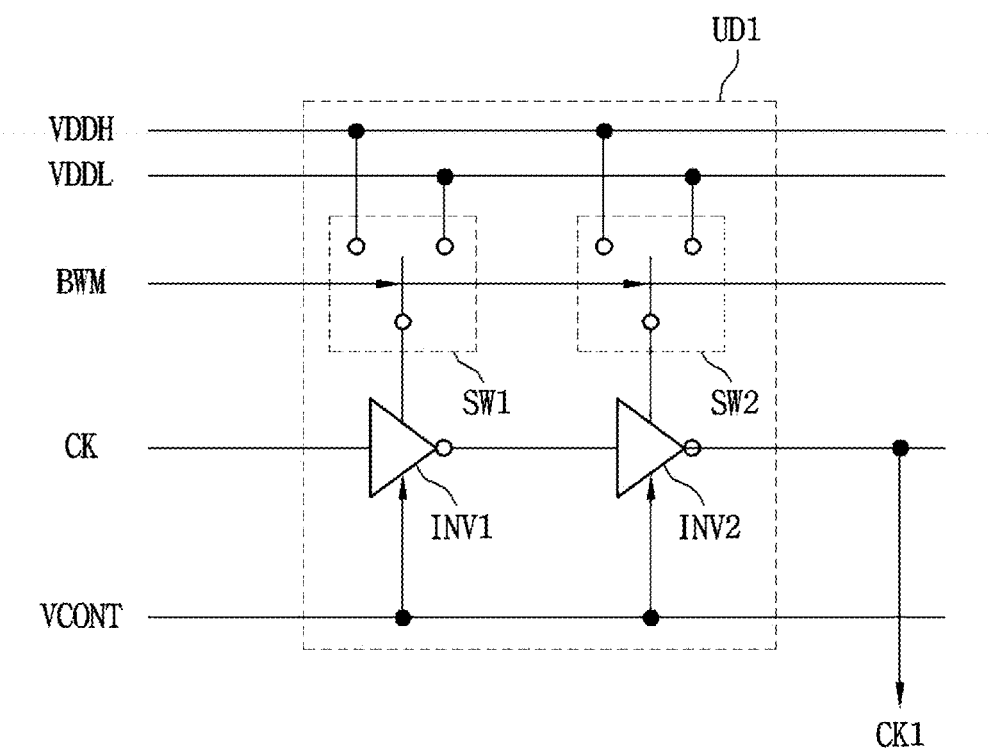
FIG. 4 is a detailed circuit diagram showing an aspect of a delay unit of FIG. 3.

FIG. 4 is to explain the detailed configuration of each of the delay units UD1 to UD2n+1. For the explanation of the aspect, FIG. 4 illustrates the first delay unit UD1.

The delay unit UD1 may include a first inverter INV1, a second inverter INV2 and a switch circuit. The first inverter INV1 and the second inverter INV2 are connected in series, and the switch circuit may include a first switch SW1 and a second switch SW2.

In the above configuration, the switch circuit may be configured to provide a driving voltage, selected between the first driving voltage VDDL and the second driving voltage VDDH in response to the mode signal BWM, to the first inverter INV1 and the second inverter INV2.

The first switch SW1 is configured to provide a driving voltage, selected between the first driving voltage VDDL and the second driving voltage VDDH in response to the mode signal BWM, to the first inverter INV1, and the second switch SW2 is configured to provide a driving voltage, selected between the first driving voltage VDDL and the second driving voltage VDDH in response to the mode signal BWM, to the second inverter INV2.

The first inverter INV1 is configured to form an input side of the delay unit UD1, receive the input clock CK, invert the input clock CK and transfer an output to the second inverter INV2.

The second inverter INV2 is configured to form an output side of the delay unit UD1, invert the output of the first inverter INV1 and output the delayed clock CK1.

Namely, the delay unit UD1 outputs the delayed clock CK1 which is obtained by delaying the input clock CK by the unit delay time td corresponding to the level of the voltage control signal VCONT by the first inverter INV1 and the second inverter INV2.

In more detail, the first inverter INV1 and the second inverter INV2 receive the voltage control signal VCONT, and a delay time may be controlled according to the level of the voltage control signal VCONT. That is to say, when the level of the voltage control signal VCONT increases, the driving currents of the first inverter INV1 and the second inverter INV2 increase, and as a result, the unit delay time td obtained by summing the respective delay times of the first inverter INV1 and the second inverter INV2 may be shortened. The shortening of the unit delay time td means that the operating frequency of the delayed clock CK1 increases. Conversely, when the level of the voltage control signal VCONT decreases, the driving currents of the first inverter INV1 and the second inverter INV2 decrease, and as a result, the unit delay time td obtained by summing the respective delay times of the first inverter INV1 and the second inverter INV2 may be lengthened. The lengthening of the unit delay time td means that the operating frequency of the delayed clock CK1 decreases.

The first inverter INV1 and the second inverter INV2 may receive, as a driving voltage, one of the first driving voltage VDDL and the second driving voltage VDDH through the first switch SW1 and the second switch SW2. The second driving voltage VDDH may have a level higher than the first driving voltage VDDL.

When the first inverter INV1 and the second inverter INV2 are driven by a high driving voltage, an output response may be fast. Therefore, due to the operation characteristics of the first inverter INV1 and the second inverter INV2 according to a level change of the driving voltage, the delayed clock CK1 of the delay unit UD1 may have an operating frequency of a relatively low first frequency range in response to the first driving voltage VDDL, and may have an operating frequency of a second frequency range higher than the first frequency range in response to the second driving voltage VDDH higher than the first driving voltage VDDL.

Figure 5:
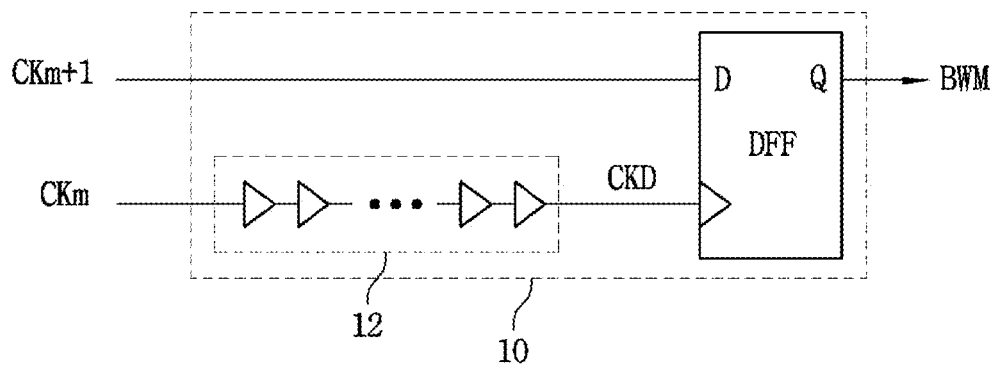
FIG. 5 is a circuit diagram showing an aspect of a mode generator of FIG. 2.

The above-described operations of the first switch SW1 and the second switch SW2 for selecting a driving voltage may be controlled by the mode signal BWM, and the mode signal BWM may be provided by the mode generator 10 which is configured as shown in FIG. 5.

The mode generator 10 is configured to receive the input-side first delayed clock CKm and the output-side second delayed clock CKm+1 of the delay unit designated in advance among the plurality of delay units of multiple stages included in the delay line 20, and to provide the mode signal BWM by comparing the unit delay time td between the first delayed clock CKm and the second delayed clock CKm+1 with the preset reference delay time tfd. The first delayed clock CKm and the second delayed clock CKm+1 may be exemplified as input-side and output-side delayed clocks of the second delay unit UD2.

To this end, the mode generator 10 may include a delay block 12 and a determiner DFF.

The delay block 12 is configured to output a reference delayed clock CKD by delaying the first delayed clock CKm by the reference delay time tfd. To this end, the delay block 12 may be configured by a buffer chain composed of a plurality of buffers, and the number of buffers included in the buffer chain may be set to delay the first delayed clock CKm by the reference delay time tfd.

The determiner DFF is configured to receive the second delayed clock CKm+1 and the reference delayed clock CKD and output the mode signal BWM which has a level corresponding to the second delayed clock CKm+1 at a rising time point of the reference delayed clock CKD.

To this end, the determiner DFF may be configured to include a D flip-flop. It may be understood that the D flip-flop includes a clock terminal, an input terminal D and an output terminal Q. For example, the D flip-flop may be configured to latch the signal of the input terminal D when the clock of the clock terminal transitions to a high level and output an output through the output terminal Q.

The D flip-flop may be configured to output the mode signal BWM through the output terminal Q to have a level corresponding to the level of the second delayed clock CKm+1 at a rising time point of the reference delayed clock CKD. In other words, it may be understood that the D flip-flop latches the second delayed clock CKm+1 corresponding to a rising time point of the reference delayed clock CKD and outputs the mode signal BWM having the same level as the latched second delayed clock CKm+1.

By the above-described configuration, the mode generator 10 may provide the mode signal BWM for selecting one of the first driving voltage VDDL and the second driving voltage VDDH as a driving voltage according to a change in the unit delay time td.

In the mode generator 10, the reference delay time tfd of the delay block 12, which outputs the reference delayed clock CKD by delaying the first delayed clock CKm, is fixed.

In the case of the clock data signal CED for a low-speed operation, the unit delay time td between the first delayed clock CKm and the second delayed clock CKm+1 relatively increases. Namely, the data recovery circuit 300 recovers data at a relatively low operating frequency. Conversely, in the case of the clock data signal CED for a high-speed operation, the unit delay time td between the first delayed clock CKm and the second delayed clock CKm+1 relatively decreases. Namely, the data recovery circuit 300 recovers data at a relatively high operating frequency.

The mode generator 10 is configured to determine the unit delay time td that is changed as described above, by using the fixed reference delay time tfd, and may provide the mode signal BWM of a high or low level according to a determination result.

Figure 6:
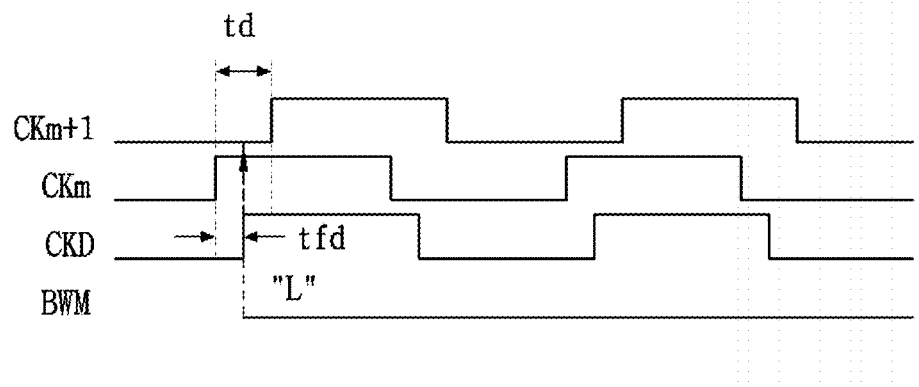
FIG. 6 is a timing diagram showing determination of a low operating frequency in the mode generator.

FIG. 6 is a timing diagram showing determination of a low operating frequency of delayed clocks by the mode generator 10.

In the case of the clock data signal CED for a low-speed operation, the unit delay time td between the first delayed clock CKm and the second delayed clock CKm+1 is longer than the reference delay time tfd.

In this case, in the mode generator 10, the transition time point of the reference delayed clock CKD, that is, a time point at which the reference delayed clock CKD is changed from a low level to a high level, is earlier than the transition time point of the second delayed clock CKm+1, that is, a time point at which the second delayed clock CKm+1 is changed from a low level to a high level.

That is to say, at the transition time point of the reference delayed clock CKD, the second delayed clock CKm+1 has a low level.

Therefore, the determiner DFF may output the mode signal BWM of a low level at the time point when the reference delayed clock CKD transitions to a high level.

In this case, the first switch SW1 and the second switch SW2 of the delay line 20 may provide the first driving voltage VDDL as a driving voltage, and the delay units UD1 to UD2n+1 of the delay line 20 may output the delayed clocks CK1 to CK2n+1 in which the unit delay time td is delayed using the first driving voltage VDDL.

The frequency range of the delayed clocks CK1 to CK2n+1 is determined by the first driving voltage VDDL, and a change in operating frequency by a change in the unit delay time td of the delay units UD1 to UD2n+1 by the voltage control signal VCONT may be implemented within a frequency range determined by the first driving voltage VDDL.

Figure 7:
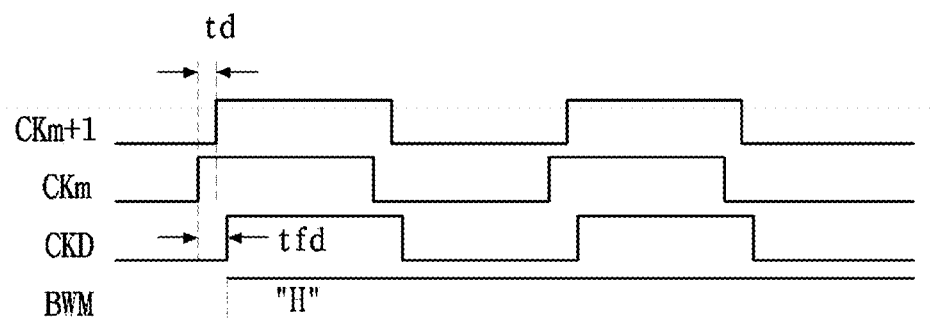
FIG. 7 is a timing diagram showing determination of a high operating frequency in the mode generator.

FIG. 7 is a timing diagram showing determination of a high operating frequency of delayed clocks by the mode generator 10.

In the case of the clock data signal CED for a high-speed operation, the unit delay time td between the first delayed clock CKm and the second delayed clock CKm+1 is shorter than the reference delay time tfd.

In this case, in the mode generator 10, the transition time point of the reference delayed clock CKD, that is, a time point at which the reference delayed clock CKD is changed from a low level to a high level, is later than the transition time point of the second delayed clock CKm+1, that is, a time point at which the second delayed clock CKm+1 is changed from a low level to a high level.

That is to say, at the transition time point of the reference delayed clock CKD, the second delayed clock CKm+1 has a high level.

Therefore, the determiner DFF may output the mode signal BWM of a high level at the time point when the reference delayed clock CKD transitions to a high level.

In this case, the first switch SW1 and the second switch SW2 of the delay line 20 may provide the second driving voltage VDDH as a driving voltage, and the delay units UD1 to UD2n+1 of the delay line 20 may output the delayed clocks CK1 to CK2n+1 in which the unit delay time td is delayed using the second driving voltage VDDH.

The frequency range of the delayed clocks CK1 to CK2n+1 is determined by the second driving voltage VDDH, and a change in operating frequency by a change in the unit delay time td of the delay units UD1 to UD2n+1 by the voltage control signal VCONT may be implemented within a frequency range determined by the second driving voltage VDDH.

Figure 8:
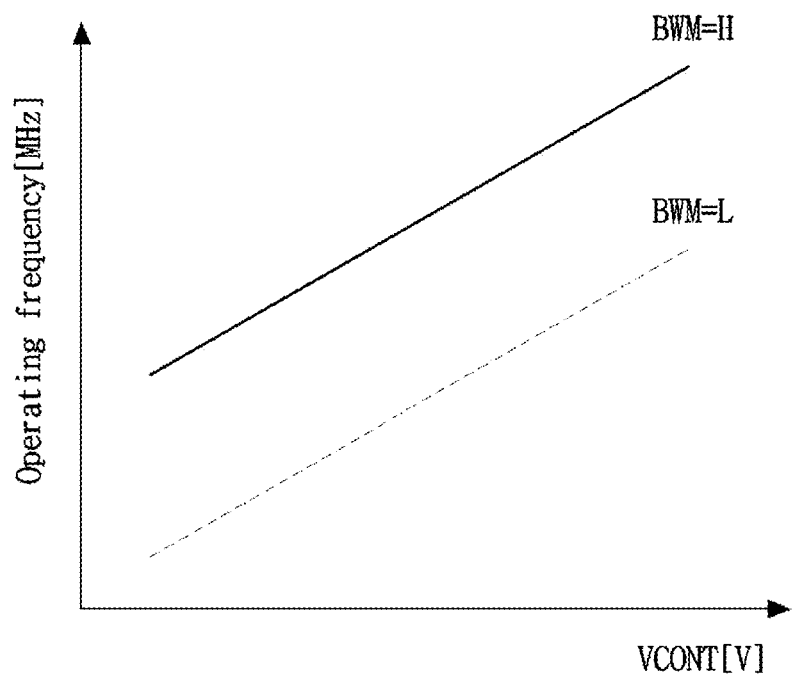
FIG. 8 is a graph for explaining the bandwidth of an operating frequency.

As described above, the bandwidth of the operating frequencies of the delayed clocks CK1 to CK2n+1 of the present disclosure may be changed according to the level of the driving voltage provided to the delay units UD1 to UD2n+1 of the delay line 20, as shown in FIG. 8.

When the mode signal BWM of a high level is provided by the determiner DFF, the frequency range of the operating frequencies of the delayed clocks CK1 to CK2n+1 outputted from the delay line 20 may be formed higher than that when the mode signal BWM of a low level is provided by the determiner DFF.

Conversely, when the mode signal BWM of a low level is provided by the determiner DFF, the frequency range of the operating frequencies of the delayed clocks CK1 to CK2n+1 outputted from the delay line 20 may be formed lower than that when the mode signal BWM of a high level is provided by the determiner DFF.

In the present disclosure, the bandwidth of an operating frequency may be changed according to a change in the unit delay time of the delayed clocks CK1 to CK2n+1.

As is apparent from the above description, in the present disclosure, since delayed clocks of a wide bandwidth may be generated using driving voltages having different levels, it is possible to recover a clock in correspondence to an operating frequency of a wide bandwidth.

Therefore, the present disclosure provides advantages in that it is possible to recover a clock and data with a wide bandwidth.

In addition, in the present disclosure, a change in frequency may be detected by comparing changes in unit delay times of the delayed clocks with a preset reference delay time without the necessity of providing a separate option signal from the outside, and as a result, an advantage is provided in that it is possible to easily implement the recovery of a clock in a high-speed operation.

It will be apparent to those skilled in the art that various modifications and variations can be made in the clock data recovery circuit of the display and the clock recovery circuit thereof of the present disclosure without departing from the spirit or scope of the aspects of the present disclosure. Thus, it is intended that the present disclosure covers the modifications and variations of the aspects provided they come within the scope of the appended claims and their equivalents.

What is claimed is:

1. A clock recovery circuit of a display, comprising:
   a delay line configured to delay an input clock through delay units of multiple stages, and output delayed clocks from the delay units, respectively; and
   a mode generator configured to receive an input-side first delayed clock and an output-side second delayed clock and output a mode signal,
   wherein the mode generator generates a reference delayed clock by delaying the first delayed clock by a reference delay time, and outputs the mode signal having a level corresponding to the second delayed clock at a rising time of the reference delayed clock, and
   wherein each delay unit outputs the delayed clock by a driving voltage selected between a first driving voltage and a second driving voltage of different levels in response to the mode signal.

2. The clock recovery circuit according to claim 1, wherein each delay unit outputs the delayed clock which is delayed by a unit time using the first driving voltage or the second driving voltage,
   the delayed clock has an operating frequency of a first frequency range in response to the first driving voltage, and has an operating frequency of a second frequency range higher than the first frequency range in response to the second driving voltage higher than the first driving voltage.

3. The clock recovery circuit according to claim 1, wherein each delay unit comprises:
   a switch circuit configured to provide the driving voltage selected between the first driving voltage and the second driving voltage in response to the mode signal;
   a first inverter forming an input side; and
   a second inverter forming an output side, and connected in series to the first inverter,
   wherein the delayed clock which is delayed is outputted by the first inverter and the second inverter, and
   wherein the delayed clock has an operating frequency of a first frequency range in response to the first driving voltage, and has an operating frequency of a second frequency range higher than the first frequency range in response to the second driving voltage higher than the first driving voltage.

4. The clock recovery circuit according to claim 3, wherein the voltage control signal corresponding to a phase difference between the reference clock and the feedback clock selected among the delayed clocks is provided to the first inverter and the second inverter.

5. The clock recovery circuit according to claim 3, wherein the switch circuit comprises:
   a first switch configured to provide the driving voltage selected between the first driving voltage and the second driving voltage in response to the mode signal, to the first inverter; and
   a second switch configured to provide the driving voltage selected between the first driving voltage and the second driving voltage in response to the mode signal, to the second inverter.

6. The clock recovery circuit according to claim 1, wherein, when the rising time of the reference delayed clock corresponds to a high level of the second delayed clock, the mode generator provides the mode signal which selects a higher one of the first driving voltage and the second driving voltage as the driving voltage, and
   when the rising time of the reference delayed clock corresponds to a low level of the second delayed clock, the mode generator provides the mode signal which selects a lower one of the first driving voltage and the second driving voltage as the driving voltage.

7. The clock recovery circuit according to claim 1, wherein the mode generator comprises:
 a delay block configured to output the reference delayed clock by delaying the first delayed clock by the reference delay time; and
 a determiner configured to receive the second delayed clock and the reference delayed clock, and output the mode signal having a level corresponding to the second delayed clock at a rising time point of the reference delayed clock.

8. The clock recovery circuit according to claim 7, wherein the determiner includes a D flip-flop, and
 the D flip-flop latches the second delayed clock corresponding to the rising time point of the reference delayed clock, and outputs the mode signal of the same level as the latched second delayed clock.

9. A clock data recovery circuit of a display, comprising:
 a clock recovery circuit configured to delay an input clock through delay units of multiple stages, and output delayed clocks from the delay units, respectively; and
 a data recovery circuit configured to recover data of a clock data signal using a recovered clock selected among the delayed clocks,
 wherein the clock recovery circuit receives an input-side first delayed clock and an output-side second delayed clock and configured to output a mode signal, generates a reference delayed clock by delaying the first delayed clock by a reference delay time, and outputs a mode signal having a level corresponding to the second delayed clock at a rising time of the reference delayed clock, and
 wherein the clock recovery circuit outputs the delayed clocks by driving the delay units by a driving voltage selected between a first driving voltage and a second driving voltage of different levels in response to the mode signal.

10. The clock data recovery circuit according to claim 9, wherein the clock recovery circuit comprises:
 a delay line configured to delay the input clock through the delay units of multiple stages, and output the delayed clocks from the delay units, respectively; and
 a mode generator configured to receive the first delayed clock and the second delayed clock, and provide the mode signal,
 wherein each delay unit outputs the delayed clock by a driving voltage selected between the first driving voltage and the second driving voltage of different levels in response to the mode signal.

11. The clock data recovery circuit according to claim 10, wherein each delay unit comprises:
 a switch circuit configured to provide the driving voltage selected between the first driving voltage and the second driving voltage in response to the mode signal;
 a first inverter forming an input side; and
 a second inverter forming an output side, and connected in series to the first inverter,
 wherein the delayed clock which is delayed is outputted by the first inverter and the second inverter, and
 wherein the delayed clock has an operating frequency of a first frequency range in response to the first driving voltage, and has an operating frequency of a second frequency range higher than the first frequency range in response to the second driving voltage higher than the first driving voltage.

12. The clock data recovery circuit according to claim 11, wherein the voltage control signal corresponding to a phase difference between the reference clock and the feedback clock selected among the delayed clocks is provided to the first inverter and the second inverter.

13. The clock data recovery circuit according to claim 12, further comprising:
 a delay controller configured to output the voltage control signal,
 wherein the reference clock uses a first delayed clock which is outputted from a delay unit of a position designated in advance, and
 wherein the feedback clock uses a second delayed clock which is outputted from a last delay unit.

14. The clock data recovery circuit according to claim 13, wherein the delay controller comprises:
 a phase comparator configured to output an up control signal and a down control signal corresponding to a phase difference between the reference clock and the feedback clock;
 a charge pump configured to provide an output voltage according to performing a pull-up in response to the up control signal or a pull-down in response to the down control signal; and
 a loop filter configured to provide the voltage control signal corresponding to the output voltage.

15. The clock data recovery circuit according to claim 10, wherein, when the rising time of the reference delayed clock corresponds to a high level of the second delayed clock, the mode generator provides the mode signal which selects a higher one of the first driving voltage and the second driving voltage as the driving voltage, and
 when the rising time of the reference delayed clock corresponds to a low level of the second delayed clock, the mode generator provides the mode signal which selects a lower one of the first driving voltage and the second driving voltage as the driving voltage.

16. A data reception device of a display, comprising:
 a clock recovery circuit configured to delay an input clock through delay units of multiple stages, and output delayed clocks from the delay units, respectively; and
 a data recovery circuit configured to recover data of a clock data signal using a recovered clock selected among the delayed clocks,
 wherein the clock recovery circuit receives an input-side first delayed clock and an output-side second delayed clock and configured to output a mode signal, generates a reference delayed clock by delaying the first delayed clock by a reference delay time, and outputs a mode signal having a level corresponding to the second delayed clock at a rising time of the reference delayed clock,
 wherein the clock recovery circuit outputs the delayed clocks by driving the delay units by a driving voltage selected between a first driving voltage and a second driving voltage of different levels in response to the mode signal.

17. The data reception device according to claim 16, wherein the clock recovery circuit comprises:
 a delay line configured to delay the input clock through the delay units of multiple stages, and output the delayed clocks from the delay units, respectively; and
 a mode generator configured to receive the first delayed clock and the second delayed clock, and provide the mode signal,
 wherein each delay unit outputs the delayed clock by a driving voltage selected between the first driving voltage and the second driving voltage of different levels in response to the mode signal.

18. The data reception device according to claim 17, wherein each delay unit comprises:
a switch circuit configured to provide the driving voltage selected between the first driving voltage and the second driving voltage in response to the mode signal;
a first inverter forming an input side; and
a second inverter forming an output side, and connected in series to the first inverter,
wherein the delayed clock which is delayed is outputted by the first inverter and the second inverter, and
wherein the delayed clock has an operating frequency of a first frequency range in response to the first driving voltage, and has an operating frequency of a second frequency range higher than the first frequency range in response to the second driving voltage higher than the first driving voltage.

19. The data reception device according to claim 18, wherein the voltage control signal corresponding to a phase difference between the reference clock and the feedback clock selected among the delayed clocks is provided to the first inverter and the second inverter.

20. The data reception device according to claim 19, further comprising:
a delay controller configured to output the voltage control signal,
wherein the reference clock uses a first delayed clock which is outputted from a delay unit of a position designated in advance, and
wherein the feedback clock uses a second delayed clock which is outputted from a last delay unit.

* * * * *